United States Patent
Zeller (10) Patent No.: US 10,775,468 B2
(45) Date of Patent: Sep. 15, 2020

(54) MAGNETIC RESONANCE METHOD AND APPARATUS

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 152 days.

(21) Appl. No.: 15/964,121

(22) Filed: Apr. 27, 2018

(65) Prior Publication Data

US 2018/0313927 A1 Nov. 1, 2018

(30) Foreign Application Priority Data

Apr. 27, 2017 (DE) .................. 10 2017 207 128

(51) Int. Cl.
| | |
|---|---|
| *G01R 33/561* | (2006.01) |
| *G01R 33/58* | (2006.01) |
| *G01R 33/48* | (2006.01) |

(52) U.S. Cl.
CPC ..... *G01R 33/5617* (2013.01); *G01R 33/4818* (2013.01); *G01R 33/5611* (2013.01); *G01R 33/583* (2013.01); *G01R 33/4828* (2013.01)

(58) Field of Classification Search
CPC ............ G01R 33/5617; G01R 33/5611; G01R 33/583; G01R 33/4818; G01R 33/4828
See application file for complete search history.

(56) References Cited

U.S. PATENT DOCUMENTS

| | | | | |
|---|---|---|---|---|
| 5,742,163 | A | * | 4/1998 | Liu .................. G01R 33/56554 324/307 |
| 6,400,151 | B1 | | 6/2002 | Haase et al. |
| 9,664,758 | B2 | * | 5/2017 | Stemmer ............ G01R 33/4818 |
| 9,664,762 | B2 | | 5/2017 | Banerjee et al. |
| 2012/0235681 | A1 | * | 9/2012 | Stemmer ............ G01R 33/4835 324/307 |
| 2013/0300410 | A1 | | 11/2013 | Niendorf et al. |
| 2014/0285195 | A1 | * | 9/2014 | Stemmer ............ G01R 33/4818 324/309 |
| 2015/0115958 | A1 | | 4/2015 | Wang et al. |
| 2015/0355303 | A1 | | 12/2015 | Kuhara |

(Continued)

OTHER PUBLICATIONS

Ma, et al.; "Fast Spin-Echo Triple-Echo Dixon (fTED) Technique for Ef?cient T2-Weighted Water and Fat Imaging"; Magnetic Resonance in Medicine; vol. 58; pp. 103-109; (2007).

(Continued)

*Primary Examiner* — Dixomara Vargas
(74) *Attorney, Agent, or Firm* — Schiff Hardin LLP (57) ABSTRACT

In a method and apparatus for parallel recording of a magnetic resonance dataset with a number of reception coils, wherein the measurement data acquired by each coil are a predetermined part of a complete set of k-space data, an excitation pulse applied, followed by a refocusing pulse. The resulting echo signal of an image dataset is acquired while a first read gradient activated. A gradient in the phase direction is designed to be activated in order to acquire additional echo signal while an additional readout gradient is activated. The gradient in the phase direction is designed so that the additional echo signal contains k-space data that supplements the predetermined part of the k-space data.

18 Claims, 5 Drawing Sheets

(56) References Cited

U.S. PATENT DOCUMENTS

2017/0089999 A1    3/2017  Zeller et al.
2017/0146631 A1*   5/2017  Beck ................. G01R 33/4833
2017/0276755 A1    9/2017  Hoge et al.

OTHER PUBLICATIONS

Glover. et al.: "Three-Point Dixon Technique for True Water/Fat Decomposition with Bo Inhomogeneity Correction";: Magnetic Resonance in Medicine; vol. 18; pp. 371-383; (1991).
Oshio, Koichi et al. "GRASE (Gradient- and Spin-Echo) Imaging: A Novel Fast MRI technique" Magnetic Resonance in Medicine, vol. 20, pp. 349-349, 1991; 1991.

* cited by examiner

MAGNETIC RESONANCE METHOD AND APPARATUS

BACKGROUND OF THE INVENTION

Field of the Invention

The present invention concerns the field of magnetic resonance imaging, and in particular concerns magnetic resonance methods and apparatuses that facilitate adjustments relating to the acquisition of magnetic resonance data.

Description of the Prior Art

It is known that an adjustment measurement can be undertaken automatically before a diagnostic magnetic resonance data acquisition is carried out. For example, preliminary scans are carried out in order to determine the resonant frequency exactly or to perform shimming in an automated manner.

To enable information to be obtained about the distribution of spin species, in particular of water and fat protons, some of the methods used are based on their respective resonant frequencies. Known methods are the 2-point Dixon technique and the 3-point Dixon technique for example, cf. Glover and Schneider, Three Point Dixon Technique for True Water/Fat Decomposition with B0 Inhomogeneity Correction, Magn Res Med 18, P. 371-383, 1991. The 3-point Dixon technique has also been proposed in order to achieve a separation even with inhomogeneous B0 fields. This technique, however, is obsolete for magnetic resonance apparatuses in accordance with the state of the art, which is why, particularly because of its faster calculation, the 2-point Dixon method is employed.

Moreover, before the measurement (diagnostic data acquisition) begins or during the measurement with the use of reception coil arrays, wherein the measurement data are reconstructed with a method such as GRAPPA, calibration data are collected by at least one complete image dataset being acquired for calibration purposes.

Furthermore the number and location of the measurement slices for individual measurements is defined.

This method is time-consuming and leads to a certain degree of waiting time after a patient has been introduced into the magnetic resonance apparatus (scanner).

SUMMARY OF THE INVENTION

An object of the present invention is to provide a method with which it adjustment measures can be implemented more rapidly.

This object is achieved by a method for parallel recording of a magnetic resonance dataset with a number of reception coils, wherein the measurement data received (detected) by each coil contains a predetermined part of a complete set of k-space data, with which the data acquisition scanner with the following steps is operated:
- a1) Applying an excitation pulse,
- b1) Applying a refocusing pulse,
- c1) Reading out an echo signal of an image dataset while a first read gradient is present,
- d1) Applying a gradient in the phase direction, and
- e1) Reading out an additional signal while an additional read gradient is present, wherein
- f1) The gradient in step d1) is chosen so that the additional echo signal contains k-space data that supplements the predetermined part of k-space data.

The steps set forth above are implemented by the generation of control signals within a control computer of a magnetic resonance apparatus, the control signals being designed or selected in order to create a protocol that will cause the above steps to be implemented. The control signals are then provided from the computer to the data acquisition scanner in order to cause the protocol to be executed by the data acquisition scanner. The acquired k-space data are entered into a memory, from which the k-space data are accessible as a data file for subsequent processing, such as image reconstruction.

The basis of the invention is building-in or supplementing a gradient echo train in a spin echo-based method so that a number of gradient echoes are recorded. The method is preferably to be implemented in adjustment methods, i.e. a method relating to the determination of the resonant frequency, a method for carrying out a shim, a method for determining the water and fat distribution in the examination object, etc. If the measurement data are collected by parallel imaging, there is then the option of undertaking the actual measurement as usual and using the additional gradient echo for supplementing the dataset undersampled as a result of the recording scheme during parallel imaging, such that a complete dataset with calibration data is available. This enables two adjustment measurements to be combined with one another and in this way enables one of them to be saved. This enables the waiting time before the beginning of patient-related experiments to be shortened.

Since various measurement sequences will be discussed below, the following definitions will be made first, which are to apply in the present invention:

A measurement sequence is defined, as is usual, as a sequence of RF pulses, gradient fields, wait times and acquisition windows, which precisely define and characterize the order of the measurement sequence. Examples of measurement sequences are FLASH, spin echo, gradient echo, FSE (Fast Spin Echo), EPI, TrueFisp, etc.

A measurement sequence in this case consists of defined or definable part experiments. A part experiment can also be called an excitation cycle. In a spin echo as many excitation pulses are applied as there are phase-encoded steps carried out. Accordingly there are as many excitation cycles as there are phase-encoding steps.

In a Fast Spin Echo, also called Turbo Spin Echo or RARE, a number of refocusing pulses will be used, which is why the term echo train is used. In the present invention a distinction is made in this case between an echo train as a result of a number of refocusing pulses and a gradient echo train as a result of read gradients, in particular bipolar read gradients. In a Fast Spin Echo with 128 phase encoding steps and a number of 8 echoes in an echo train, a number of only 16 excitation cycles is produced for recording a complete measurement dataset.

The length of an excitation cycle is called the repetition time and is abbreviated by "TR".

In an echo train the time between two echoes is called the interecho time and is abbreviated by "TI".

The echo time is abbreviated by "TE".

These remarks are intended to illustrate the existing conventions used by those skilled in the field of magnetic resonance imaging.

A phase-encoding gradient and/or a dephasing read gradient can be applied between the excitation pulse and the refocusing pulse. These can also be applied individually or both after the refocusing pulse however. This sometimes depends on the measurement sequence used and sometimes on the general conditions of the experiment.

It is known that activating a read gradient during the acquisition makes spatially-dependent encoding possible.

The additional read gradient is "additional" because it is possible to read out a further gradient echo. It does not mean that it is present at the same time as the first-mentioned read gradient. The first read gradient and the additional read gradient are offset in time.

Basically, a number of gradient echo signals and the additional echo signal can be contained in a gradient echo train. The process described can thus be used in sequences such as spin echo, Fast Spin Echo, GRASE, a fast spin echo-based 2-point Dixon technique, a fast spin echo-based 3-point Dixon technique etc.

During steps a1) and b1) in this order and before the further steps are undertaken, the order of the read gradients can basically vary. It is actually simpler in the implementation to append a further acquisition window to an existing experiment and accordingly to set the phase gradient in step d1). This requires only a definition as to what the predetermined part is. This designates the data of a set of data recorded by parallel imaging, in which it is always the case that each individual reception coil acquires only a part of the data of a completely recorded (filled) k-space. What part is recorded by default, and what part is left out, however, is proprietary and therefore cannot be defined as generally-applicable.

To radiate-in the excitation pulse and/or the refocusing pulse a body coil or a coil array can be used. The reading out of the gradient echoes is done here by a coil array. Each coil of the coil array records the first echo signals and the additional echo signals.

The steps b1) to f1) can be carried out several times in one excitation cycle. Thus a number of refocusing pulses for creating an echo train are used. The number of echo signals actually able to be recorded is then at least twice as large as the number of the echoes in the echo train, since always at least two gradient echoes will be created in an echo train.

The steps b1) to f1) will in particular be undertaken within an interecho time, i.e. between two or after the last refocusing pulse.

Furthermore the problem of movement artifacts exists. In order to reduce this problem the use of navigator echoes is known.

It is therefore also an object of the present invention to provide a method with which adjustment measures or other measurements are implemented while correcting movement artifacts.

This object is achieved by a method for recording a magnetic resonance dataset, with the steps for operating a magnetic resonance data acquisition scanner:

a2) Applying an excitation pulse, b2) Applying a refocusing pulse, c2) Reading out an echo signal of an image dataset, while a first read gradient is present, d2) Applying a gradient in the phase direction, and e2) Reading out a navigator echo signal while a navigator read gradient is present, wherein f2) the steps b2) to e2) are carried out several times in one excitation cycle, and g2) the gradient in step d2) is chosen in each case so that a navigator image is able to be reconstructed from the navigator echo signals for each excitation cycle.

As noted above, the steps set forth above are implemented by the generation of control signals within a control computer of a magnetic resonance apparatus, the control signals being designed or selected in order to create a protocol that will cause the above steps to be implemented. The control signals are then provided from the computer to the data acquisition scanner in order to cause the protocol to be executed by the data acquisition scanner. The acquired k-space data are entered into a memory, from which the k-space data are accessible as a data file for subsequent processing, such as image reconstruction.

In this method only the following differences exist from the method according to the invention was initially described.

The data can be acquired with a number of coils and in parallel, but this is not mandatory.

Furthermore the switching of the phase gradient before the navigator echo signal is chosen so that a navigator image is able to be reconstructed for each echo train. In the scan described above, however, the phase gradient has been arranged so that the k-space rows that have been recorded (filled) by the first gradient echoes will be supplemented.

Both methods can be implemented in a single measurement sequence. The gradient echo train then has at least three gradient echoes.

Instead of navigator echo signals, calibration signals can be created. In this case the strength of the phase gradient is to be changed in any event. In this process a separate calibration dataset can be acquired for each echo train or preferably a single calibration dataset over all echo trains for GRAPPA reconstruction. These calibration signals will be phase-encoded independently of the echo signals of image datasets, in particular independently of first and second echo signals.

Advantageously, after step c1) or c2), at least one further echo signal created as a gradient echo can be read out. In this case a second readout gradient is present. As already described above, the further method can be implemented within a number of measurement sequences. These also include measurement sequences that already have at least two gradient echoes in an echo train. Examples of these are GRASE and TGSE.

The gradient applied in step d1) or d2) can, in different excitation cycles and/or sections of an echo train, have the effect of a constant jump in the k-space. As an alternative or in addition, the gradient applied in step d1) or d2) can have the effect in different excitation cycles and/or sections of an echo train, of a different jump in the k-space. In this case the gradient moment can change from excitation cycle to excitation cycle but can also be the same for all sections of an echo train or vice versa.

Water protons and fat protons can have an opposing phase during the first echo signal. This relative position is also called "opposed phase" or "out of phase". In particular with the 2-point Dixon technique, the echo time of the first echo signal can be chosen in this manner.

Preferably water protons and fat protons have the same phase during a second echo signal. To enable a water and fat separation to be carried out the navigator echo signal or the additional echo signal is preferably the third gradient echo signal.

Water protons and fat protons can have an opposing phase during the additional echo signal or navigator echo signal. Then, with a first and second gradient echo signal, data can be collected for a 2-point Dixon method and with the following gradient echoes a navigator image and calibration data. If only the additional echo signal is acquired, this is usually opposed phase and should supplement the k-space of the opposed-phase image, i.e. the image with the first gradient echoes.

If the navigator echo signals are recorded as the third gradient echo in the gradient echo train and the additional echo signals as the fourth gradient echo, the additional gradient echo signals can be "in phase" and supplement the k-space of the in-phase image, i.e. of the image with the second gradient echoes.

Preferably bipolar gradients can be used as read gradients. These thus switch their polarity. This is usual during the creation of a gradient echo train.

A Fast Spin Echo (FSE) can be used as the measurement sequence. With three gradient echoes in a gradient echo train and eight echoes in an echo train, twenty four echoes will be acquired in one excitation cycle.

Exactly three echo signals can be recorded in a gradient echo train. With this number the interecho time will be increased only insignificantly, but a greater information yield will be obtained.

After the third read gradient, a further gradient can be applied in the phase direction, which at least partly compensates for the gradients applied in step d1) or d2). These gradients are also called phase rewind gradients.

Preferably the echo signals will be recorded with a coil array. Data recorded in parallel in this way will be reconstructed by means of specific reconstruction methods, such as GRAPPA.

Preferably, at the same time as the excitation pulse and/or refocusing pulse or the refocusing pulses a slice selection gradient can be present in each case. This makes possible a slice-selective excitation of the spins.

Preferably, after the reading out of the additional echo signal and/or navigator echo signal, a phase rewind gradient can be applied. This is intended to bring the magnetization into the center of k-space again.

The present invention also encompasses a magnetic resonance apparatus having a magnetic resonance scanner and a control computer, wherein the control computer is configured (designed or programmed) so as to operate the MR scanner in order to implement any or all embodiments of the method as described above.

The present invention also encompasses a non-transitory, computer-readable data storage medium encoded with programming instructions (code) that, when the storage medium is loaded into a computer or computer system of a magnetic resonance apparatus having a data acquisition scanner, cause the magnetic resonance apparatus to be operated so as to implement any or all embodiments of the method in accordance with the invention described above.

DESCRIPTION OF THE PREFERRED EMBODIMENTS

Figure 1:
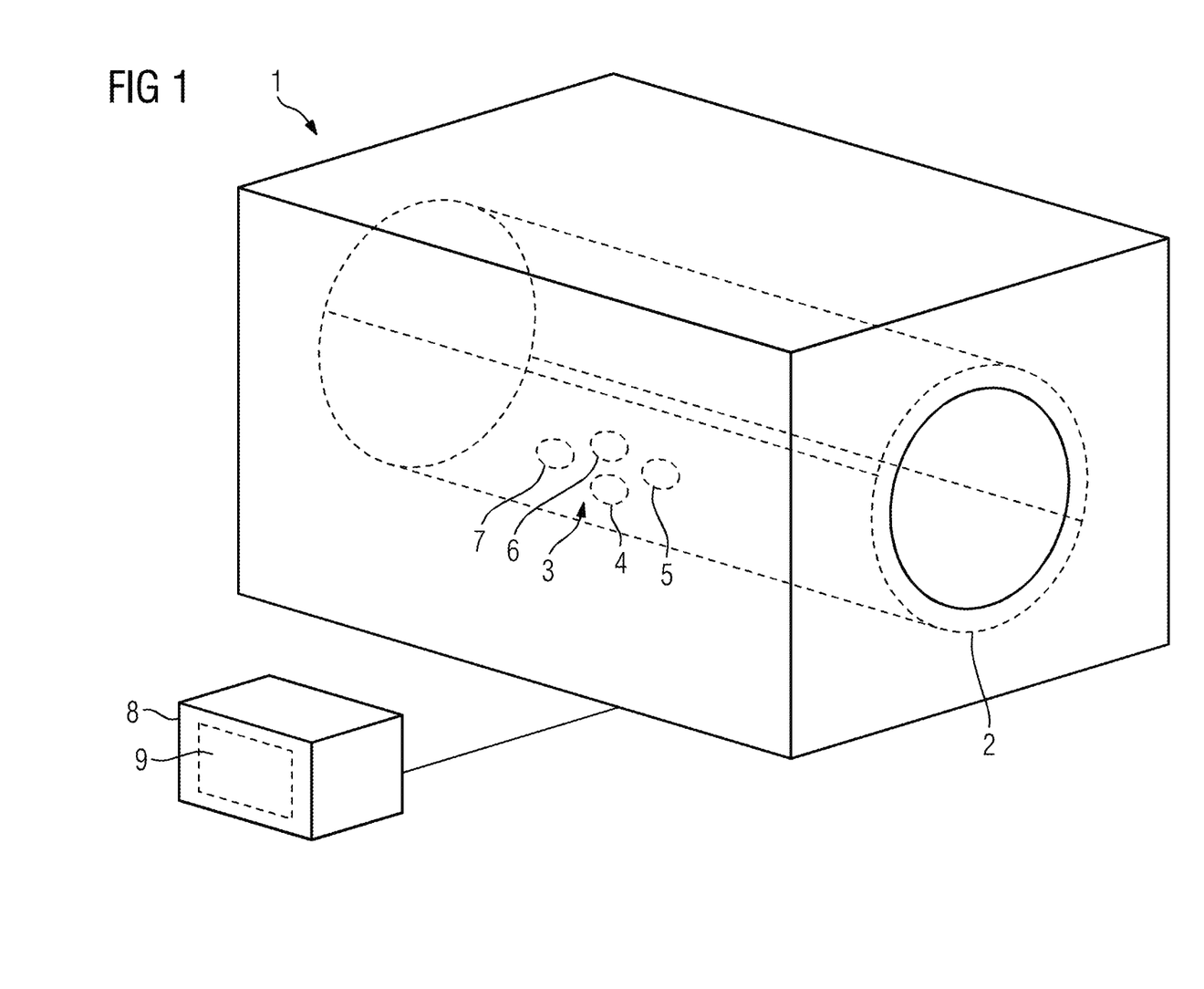
FIG. 1 schematically illustrates a magnetic resonance apparatus designed to implement the embodiment of the method according to the invention.

FIG. 1 shows a magnetic resonance apparatus 1. The apparatus 1 has a transmit coil arrangement 2. The transmit coil arrangement 2 is usually designed as a body coil, and thus consists of a single coil.

Furthermore the magnetic resonance apparatus has a reception coil arrangement. This is a coil array 3 with coils 4, 5, 6 and 7. To enable the coils to be distinguished more easily, the transmit coil 2 is shown by a dashed outline. A control computer 8 controls the operation of the magnetic resonance apparatus 1.

The magnetic resonance apparatus 1 also has a data storage medium 9 as part of the control device 8 or independent thereof, on which computer code for carrying out magnetic resonance measurements is stored.

The coil array 3 is used only to read out the measurement signal. The coils 4, 5, 6 and 7 of the coil array 3 read out the measurement signal at the same time. Instead of the coil array 3, an individual coil can also be used as the detection coil for individual embodiments of the invention.

Further components of the magnetic resonance apparatus 1, such as gradient coils and a patient bed are not shown, for clarity.

Figure 2:
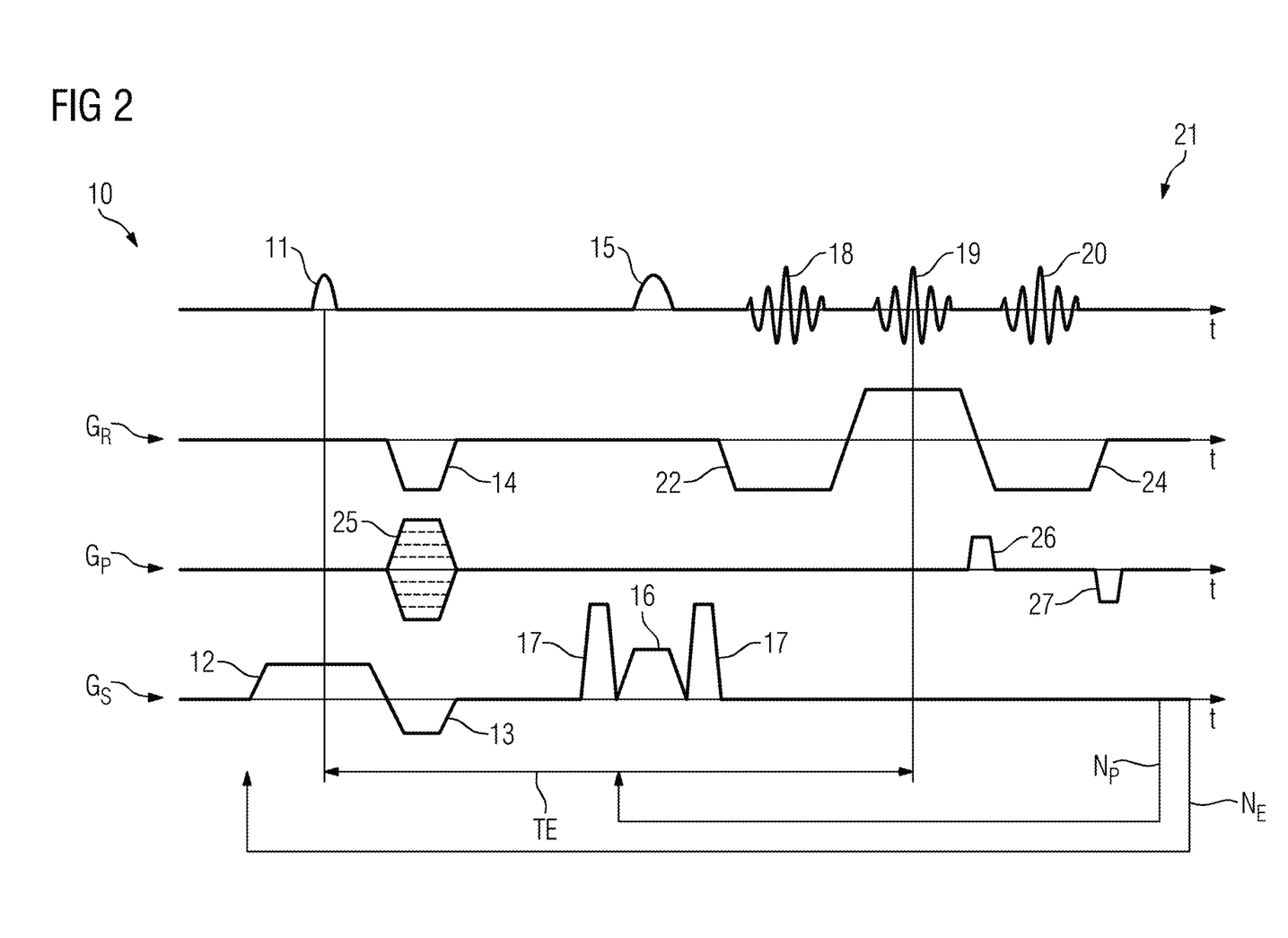
FIG. 2 shows a measurement sequence in a first embodiment of the invention.

FIG. 2 shows a sequence diagram 10 for a first embodiment of the invention. This involves a 2-point Dixon method, in which the measurement signals, or more precisely echo signals, are recorded by parallel imaging. This is to be carried out since it is not visible from the sequence diagram 10. The differences lie in the number of recordings with different phase encoding steps, which is usually abbreviated to Npe in sequence diagrams. Npe stands in this case for "number of phase encoding steps".

This number varies depending on whether the receive coil arrangement is a single coil or a coil array.

The following elements are depicted in sequence diagram 10.

An excitation pulse 11 is used to excite the magnetization. This will usually be designed to be slice-selective, which is why a slice-selection gradient 12 and a slice rephasing gradient 13 are present. These are followed by a read dephasing gradient 14. This can be applied at the same time as the slice rephasing gradient 13 or also later.

This is followed by a refocusing pulse 15. With this pulse as well, a slice selection gradient 16 can be present. In addition the refocusing pulse 15 is surrounded by spoiler gradients 17. These serve to spoil imperfections of the refocusing pulse 15.

Unlike a conventional spin echo however, three gradient echoes 18, 19 and 20 will be read out. This listens first of all for a contradiction, which can be resolved as follows: The echo with a simple spin echo is always also a gradient echo at the same time, which is why the read dephasing gradient 14 is also present. Therefore a number of gradient echoes can also be created in one spin echo. In such cases the central gradient echo 19 is also that echo of which the center defines the echo time TE. The gradient echoes 18, 19 and 20 in such cases form a gradient echo train 21. This can basically comprise two or more gradient echoes and is preferably realized as in FIG. 2 by means of bipolar gradients.

The read gradients 22, 23 and 24 are present during the readout of the gradient echoes 18, 19 and 20.

The phase encoding gradient 25 is used for encoding the second spatial direction. As shown, this can occur before the refocusing pulse 15 or also after it.

So that the third gradient echo 20 can be used as a calibration signal, a phase gradient 26 is switched after the second gradient echo 19, which puts the magnetization around a desired position in the k-space into the ky direction. Such phase gradients 26 are also called blips. After the readout of the third gradient echoes 20 the effect of the phase gradient 26 will again be compensated for by a phase rewind gradient 27.

In such cases, three echoes or even more can be recorded per excitation pulse 11. The application of the refocusing pulse 15 can be undertaken repeatedly in order to create more than one spin echo. This is specified by the number of echoes NE. With these the gradient echoes remain unconsidered. If NE is equal to 1, FIG. 2 shows one spin echo. If on the other hand eight refocusing pulses 15 are applied after one excitation pulse 11, for example, then NE is equal to 8. An echo train is also referred to in this context. The sequence is then called Fast Spin Echo.

In order to also enable the gradient echoes 18, 19 and 20 to be named, their number is specified as an echo number in the gradient echo train 21.

As described, the third gradient echo 2 is to be used to collect calibration data within the framework of parallel imaging.

Since, as is described above for FIG. 2, a 2-point Dixon method is involved, the water protons and fat protons, at the time of the first echo 18 and of the third echo 20, are out of phase and at the time of the second echo 19, are in phase. Apart from the T2*relaxation, identical conditions are present. The phase gradient 26 therefore enables the ky space row to be switched between the first gradient echo 18 and the third gradient echo 20. This enables further measurement data, namely the third gradient echoes 20, to be obtained during recording of a first dataset from first gradient echoes 18 and of a second dataset from second gradient echoes 19, by means of which the calibration data needed for the GRAPPA reconstruction of the first dataset and of the second dataset will be obtained without additional measurements.

In addition, by the calculation mentioned further above, a pure water image and a pure fat image are obtained.

An additional gradient echo for collection of calibration data can basically also be used in other imaging methods with mixed spin and gradient echo sampling such as GRASE. Furthermore an additional gradient echo can also be inserted into existing spin echo-based methods such as spin echo or fast spin echo, also called turbo spin echo or RARE.

Np refers to the number of excitation cycles produced. As a maximum, it is equal to the number of the phase-encoding steps, but usually is much smaller. It decreases with the number of echoes recorded in a train. In parallel imaging, only a part of the phase-encoding steps is actually undertaken.

Figure 3:
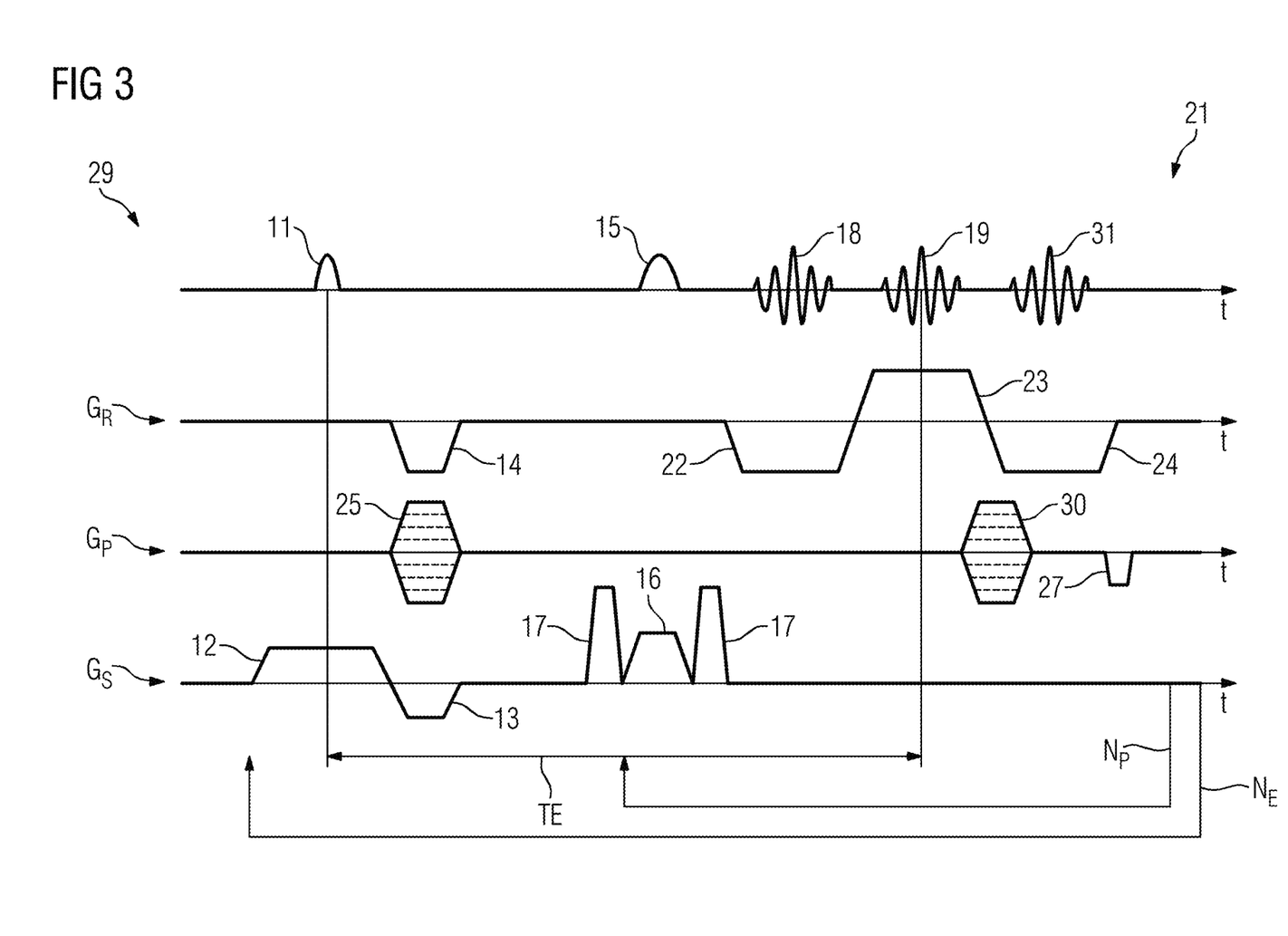
FIG. 3 shows a measurement sequence in a second embodiment of the invention.

A further measurement sequence 29 for use of the third gradient echoes 31 is shown in FIG. 3. Independently of the phase encoding of the first gradient echo 18 and of the second gradient echo 19, a phase encoding of this type of the third gradient echo 31 is applied by means of a phase rewind gradient 30, so that a navigator image is able to be established from the third gradient echoes 31 of an echo train. For example NE=16 can be used as a number of echoes. Then, for each excitation cycle, a navigator image with 16 ky-space rows is obtained. By zero filling the number of rows can be supplemented. As is usual, the number of the points in the read direction depends on the acquisition density used in the read direction.

The second phase rewind gradient 27 brings the magnetization into the center of the k-space again.

Instead of the phase encoding of a navigator image, a phase encoding of the third gradient echo can also be defined with the phase rewind gradient 30, with which the third gradient echoes 31 represent a calibration dataset independent of the first gradient echoes 18 and of the second gradient echoes 19.

This is of course not possible with a spin echo, however both with a fast gradient echo, GRASE, HASTE or a 2-point Dixon method with a number of echoes in an echo train, a navigator image for each echo train can be obtained in this manner.

Figure 4:
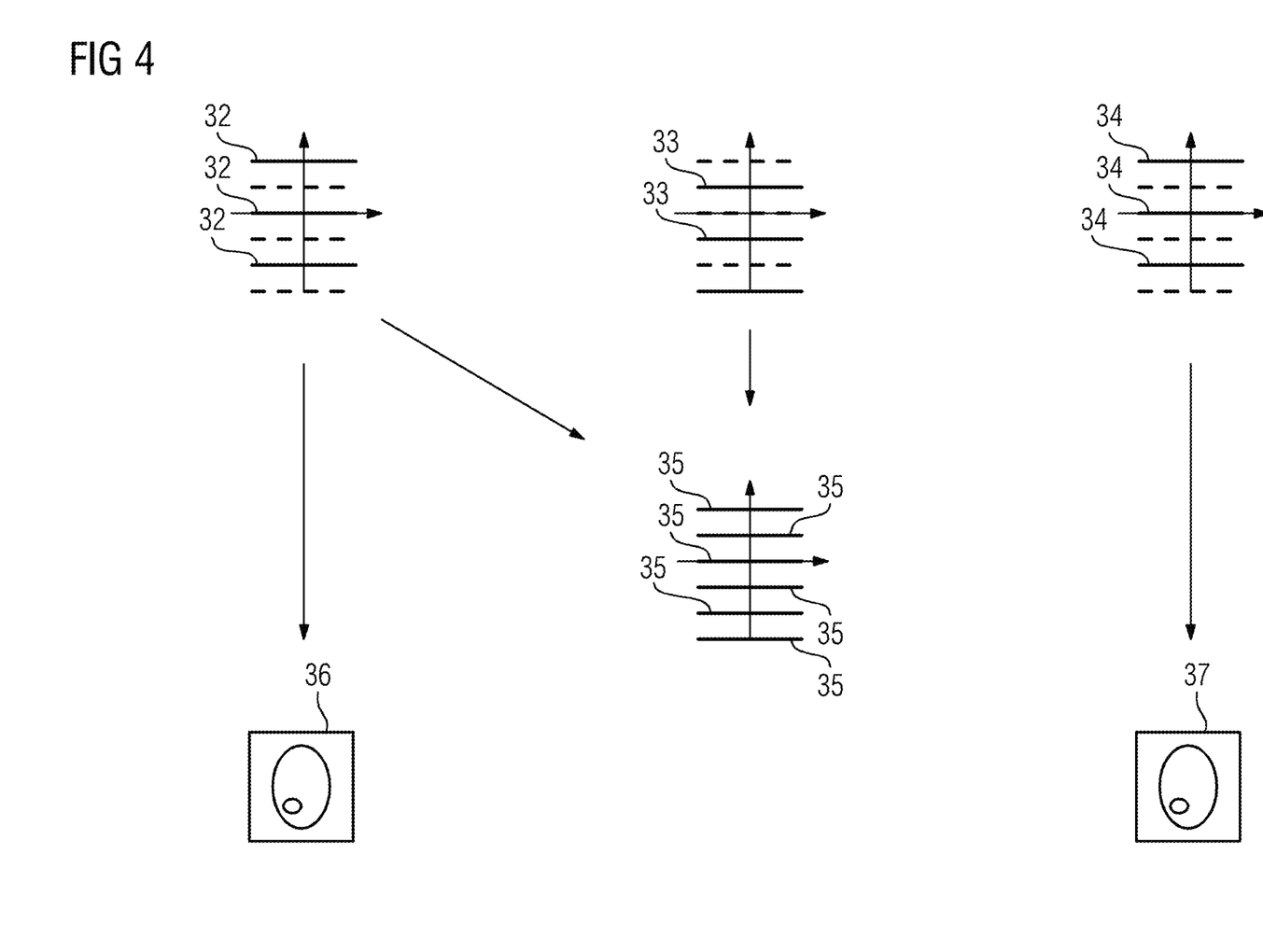
FIG. 4 shows a first reconstruction procedure in accordance with the invention.

FIG. 4 shows the reconstruction process of the measurement data for a measurement sequence such as the measurement sequence 10.

In this figure, the k-space rows 32, which have been acquired as first gradient echoes 18, and k-space rows 33, which have been acquired as third gradient echoes 20, are combined with one another into one dataset, from which calibration data 35 can be obtained for a GRAPPA reconstruction. As described above, in this case the k-space rows 33 are organized so that they supplement the k space rows 32, which do not form a complete k-space as a result of the recording scheme.

The second gradient echoes 19 form the k-space rows 34.

Calibration data 35 is formed from the k-space rows 32 and the k space rows 33. This is possible since the water and fat protons are each "opposed phase" in this case. Then, with the aid of the calibration data 35, images 36 and 37 can be reconstructed from the raw data in the form of the k-space rows 32, 33 and 34. As described above a water image and a fat image can be calculated from the images 36 and 37.

Figure 5:
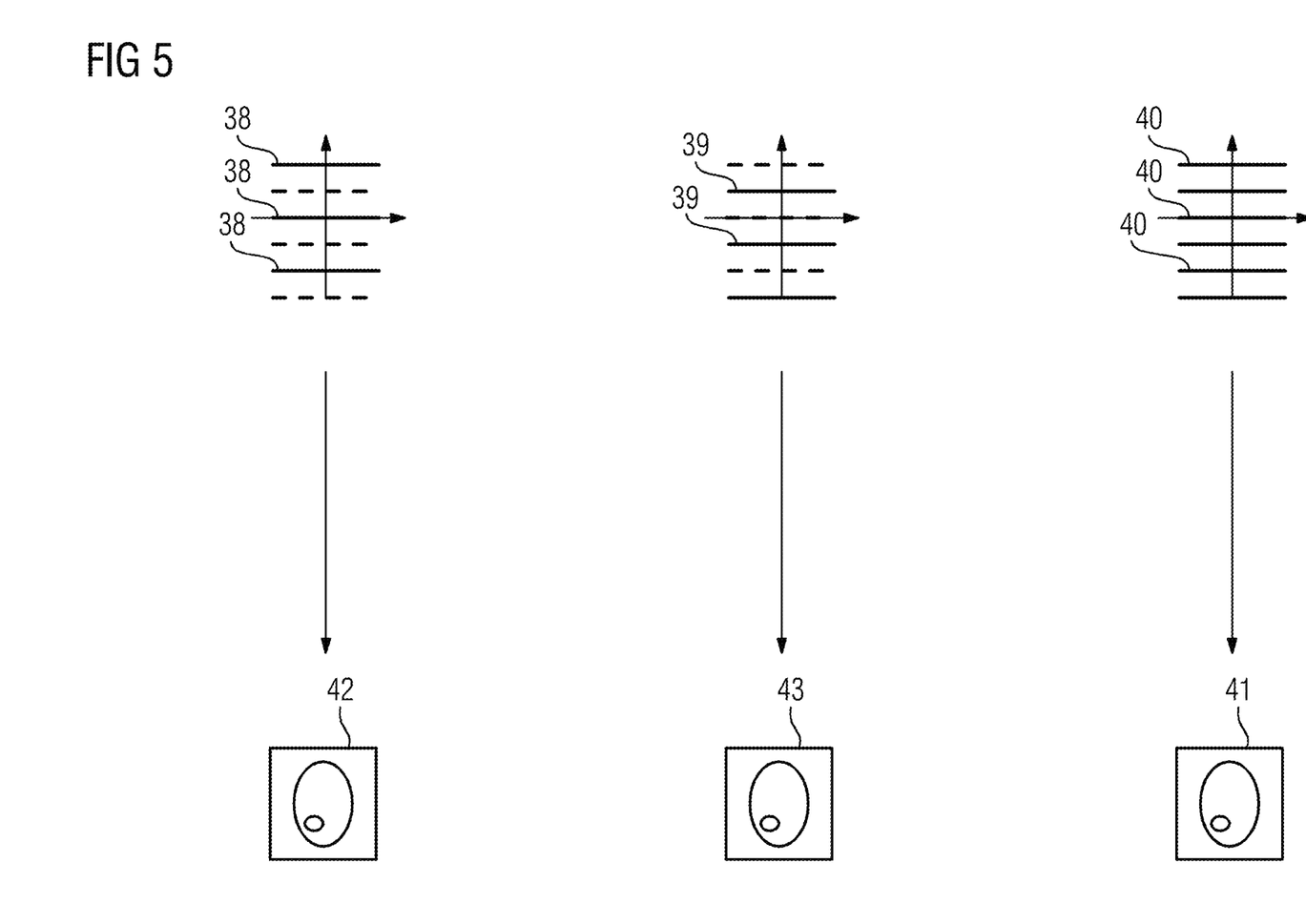
FIG. 5 shows a second reconstruction procedure in accordance with the invention.

FIG. 5 shows the reconstruction process of the measurement data for a measurement sequence like the measurement sequence 29 shown in FIG. 3.

In this figure, the first gradient echoes 18 form the k-space rows 38, the second gradient echoes 19 from the k-space rows 39 and the third gradient echoes 31 form the k-space rows 40. Independently of the reconstruction of the k-space rows 38 and 39, a navigator image 41 can be reconstructed from the k-space rows 40, and this can be a navigator image 41 for each echo train. The information obtained therefrom then can be used with respect to the location of the examination object, in order either to correct the already recorded echo signals 18 and 19 later or to already make corrections before the recording. Thus a correction can take place before each echo train.

As described above, an "opposed-phase" image 42 and an "in-phase" image 43 can be calculated from k-space rows 38 and 39 and a water and proton image can be calculated from this.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for parallel recording of a magnetic resonance (MR) dataset with a plurality of reception coils, wherein the measurement data for each coil is a predetermined part of a full set of k-space data, said method comprising operating an MR scanner by generating control signals in a computer and providing the control signals to the MR scanner so as to cause the MR scanner to perform:
   a1) applying a radio-frequency (RF) excitation pulse;
   b1) applying an RF refocusing pulse;
   c1) reading out an echo signal of an image dataset while a first read gradient is activated;
   d1) applying a gradient in a phase direction;
   e1) reading out an additional echo signal while an additional read gradient is activated, wherein the echo signal and the additional echo signal are part of a single echo train following the RF refocusing pulse with no additional RF refocusing pulses between the echo signal and the additional echo signal;

f1) activating the gradient in the phase direction in d1) so that the additional echo signal contains k-space data that supplements the predetermined part of the k-space data; and wherein the k-space data are entered into a memory are made available from the memory via the computer in electronic form as a data file.

2. The method as claimed in claim 1, comprising executing b1) to f1) multiple times in an excitation cycle.

3. The method as claimed in claim 1, comprising, after step c1), at least one further echo signal created as a gradient echo is read out.

4. The method as claimed in claim 1, comprising activating the gradient in step d1) to produce a constant jump in k-space in different excitation cycles and/or sections of an echo train.

5. The method as claimed in claim 1, comprising activating gradient in step d1) to produce a different jump in k-space in different excitation cycles and/or sections of an echo train.

6. The method as claimed in claim 1, wherein water protons and fat protons have an opposed phase during the first echo signal.

7. The method as claimed in claim 1, wherein water protons and fat protons have a same phase during a second echo signal.

8. The method as claimed in claim 1, wherein water protons and fat protons have an opposed phase during the additional echo signal or a navigator echo signal.

9. The method as claimed in claim 1, comprising activating bipolar gradients as read gradients.

10. The method as claimed in claim 1, comprising a Fast Spin Echo (FSE) as the measurement sequence.

11. The method as claimed in claim 1, comprising recording exactly three echo signals in a gradient echo train.

12. The method as claimed in claim 1, comprising, after the third read gradient, activating a further gradient in the phase direction, which compensates for the gradients applied in step e1).

13. The method as claimed in claim 1, comprising recording the echo signals with a coil array.

14. A method for parallel recording of a magnetic resonance (MR) dataset with a plurality of reception coils, wherein the measurement data for each coil is a predetermined part of a full set of k-space data, said method comprising operating an MR scanner by generating control signals in a computer and providing the control signals to the MR scanner so as to cause the MR scanner to perform:

a2) applying an excitation pulse;
b2) applying a refocusing pulse;
c2) reading out an echo signal of an image dataset while a first read gradient is activated;
d2) applying a gradient in a phase direction;
e2) reading out a navigator echo signal or a calibration signal while a navigator read gradient is activated, wherein the echo signal and the navigator echo or calibration signal are part of a single echo train following the refocusing pulse with no additional refocusing pulses between the echo signal and the navigator echo or calibration signal;
f2) executing b2) to f2) multiple times in an excitation cycle;
g2) activating the gradient in the phase direction d2) in each case to acquire navigator echo signals from which a navigator image is able to be reconstructed, or to acquire a calibration dataset from the navigator echo signals, or to acquire calibration signals for each excitation cycle; and wherein at least one of the navigator image, the calibration dataset or the calibration signals are entered into a memory, and wherein said at least one of said navigator image, said calibration dataset or said calibration signals in said memory is made available in electronic form, via the computer, as a data file.

15. A magnetic resonance (MR) apparatus comprising:

an MR data acquisition scanner comprising a plurality of reception coils;

a computer configured to operate the MR data acquisition scanner by generating control signals and providing said control signals to said MR data acquisition scanner in order to operate the MR data acquisition scanner so as to execute a data acquisition protocol wherein a predetermined part of a complete set of k-space data is respectively acquired by each coil in said plurality of coils;

said control computer, being configured to operate said MR data acquisition scanner in order to execute said protocol by (a1) applying a radio-frequency (RF) excitation pulse, (b1) applying an RF refocusing pulse, (c1) reading out an echo signal of an image dataset while a first read gradient is activated, (d1) applying a gradient in a phase direction, (e1) reading out an additional echo signal while an additional read gradient is activated, wherein the echo signal and the additional echo signal are part of a single echo train following the RF refocusing pulse with no additional RF refocusing pulses between the echo signal and the additional echo signal, (f1) activating the gradient in the phase direction in d1) so that the additional echo signal contains k-space data that supplements the predetermined part of the k-space data; and wherein the k-space data are entered into a memory are made available from the memory via the computer in electronic form as a data file.

16. A magnetic resonance (MR) apparatus comprising:

an MR data acquisition scanner comprising a plurality of reception coils;

a computer configured to operate the MR data acquisition scanner by generating control signals and providing said control signals to said MR data acquisition scanner in order to operate the MR data acquisition scanner so as to execute a data acquisition protocol wherein a predetermined part of a complete set of k-space data is respectively acquired by each coil in said plurality of coils;

said computer being configured to operate the MR data acquisition scanner in order to execute said protocol by (a2) applying an excitation pulse, (b2) applying a refocusing pulse, (c2) reading out an echo signal of an image dataset while a first read gradient is activated, (d2) applying a gradient in a phase direction, (e2) reading out a navigator echo signal or a calibration signal while a navigator read gradient is activated, wherein the echo signal and the navigator echo or calibration signal are part of a single echo train following the refocusing pulse with no additional refocusing pulses between the echo signal and the navigator echo or calibration signal, (f2) executing b2) to f2) multiple times in an excitation cycle, (g2) activating the gradient in the phase direction d2) in each case to acquire navigator echo signals from which a navigator image is able to be reconstructed, or to acquire a calibration dataset from the navigator echo signals, or to acquire calibration signals for each excitation cycle; and wherein at least one of the navigator image, the calibration dataset or the calibration signals are entered into a memory, and wherein said at least one of said navigator image, said calibration dataset or said calibration signals in said memory is made available in electronic form, via the computer, as a data file.

17. A non-transitory, computer-readable data storage medium encoded with programming instructions, said storage medium being loaded into a computer of a magnetic resonance (MR) apparatus comprising an MR data acquisition scanner comprising a plurality of coils, said programming instructions causing the computer to operate the MR apparatus to acquire measurement data with each coil that comprise a predetermined part of a complete set of k-space data, said programming instructions causing said computer in said protocol to operate said MR data acquisition scanner to:

a1) apply a radio-frequency (RF) excitation pulse;
b1) apply an RF refocusing pulse;
c1) read out an echo signal of an image dataset while a first read gradient is activated;
d1) apply a gradient in a phase direction;
e1) read out an additional echo signal while an additional read gradient is activated, wherein the echo signal and the additional echo signal are part of a single echo train following the RF refocusing pulse with no additional RF refocusing pulses between the echo signal and the additional echo signal;
f1) activate the gradient in the phase direction in d1) so that the additional echo signal contains k-space data that supplements the predetermined part of the k-space data; and
wherein the k-space data are entered into a memory are made available from the memory via the computer in electronic form as a data file.

18. A non-transitory, computer-readable data storage medium encoded with programming instructions, said storage medium being loaded into a computer of a magnetic resonance (MR) apparatus comprising an MR data acquisition scanner comprising a plurality of coils, said programming instructions causing the computer to operate the MR apparatus to acquire measurement data with each coil that comprise a predetermined part of a complete set of k-space data, said programming instructions causing said computer in said protocol to operate said MR data acquisition scanner to:

a2) apply an excitation pulse;
b2) apply a refocusing pulse;
c2) read out an echo signal of an image dataset while a first read gradient is activated;
d2) apply a gradient in a phase direction;
e2) read out a navigator echo signal or a calibration signal while a navigator read gradient is activated wherein the echo signal and the navigator echo or calibration signal are part of a single echo train following the refocusing pulse with no additional refocusing pulses between the echo signal and the navigator echo or calibration signal;
f2) execute b2) to f2) multiple times in an excitation cycle;
g2) activate the gradient in the phase direction d2) in each case to acquire navigator echo signals from which a navigator image is able to be reconstructed, or to acquire a calibration dataset from the navigator echo signals, or to acquire calibration signals for each excitation cycle; and
wherein at least one of the navigator image, the calibration dataset or the calibration signals are entered into a memory, and wherein said at least one of said navigator image, said calibration dataset or said calibration signals in said memory is made available in electronic form, via the computer, as a data file.

* * * * *